United States Patent [19]
DeYoung

[11] 4,368,944
[45] Jan. 18, 1983

[54] TERMINAL CONSTRUCTION

[75] Inventor: David M. DeYoung, Bloomington, Minn.

[73] Assignee: Magnetic Controls Company, Minneapolis, Minn.

[21] Appl. No.: 184,766

[22] Filed: Sep. 8, 1980

Related U.S. Application Data

[63] Continuation of Ser. No. 178,802, Aug. 18, 1980, abandoned.

[51] Int. Cl.³ .......................................... H01R 13/40
[52] U.S. Cl. .......................... 339/221 R; 339/17 C; 339/252 R
[58] Field of Search .................... 339/17 C, 220, 221, 339/252 R

[56] References Cited

U.S. PATENT DOCUMENTS

| | | | |
|---|---|---|---|
| 2,337,692 | 12/1943 | Todd | 339/220 T |
| 2,871,551 | 2/1959 | Harris | 339/17 C |
| 3,072,880 | 1/1963 | Olsson | 339/221 R |
| 3,120,418 | 2/1964 | Deakin | 339/221 R |

Primary Examiner—Joseph H. McGlynn
Attorney, Agent, or Firm—Dorsey & Whitney

[57] ABSTRACT

A rolled up terminal end adapted for insertion into an opening in a PCB or the like comprising a first end section with an effective width less than the diameter of the PCB opening, a second section having a terminal retaining ramp means with an effective width greater than the diameter of the PCB opening and an elongated slot extending throughout at least a portion of the second section.

25 Claims, 9 Drawing Figures

U.S. Patent  Jan. 18, 1983  4,368,944
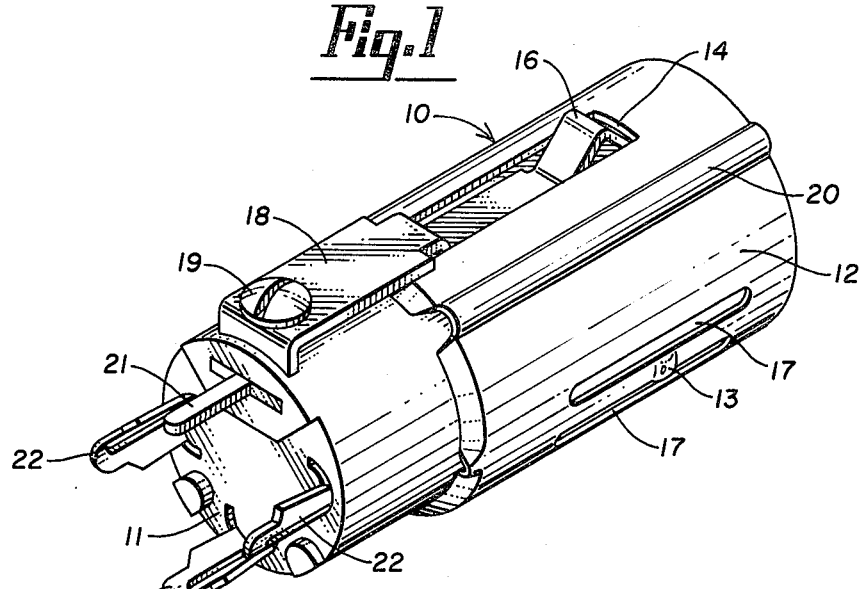
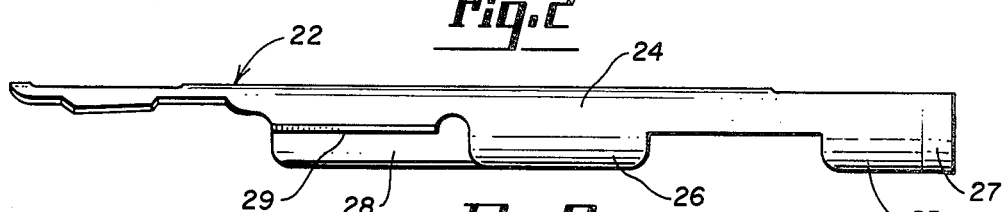
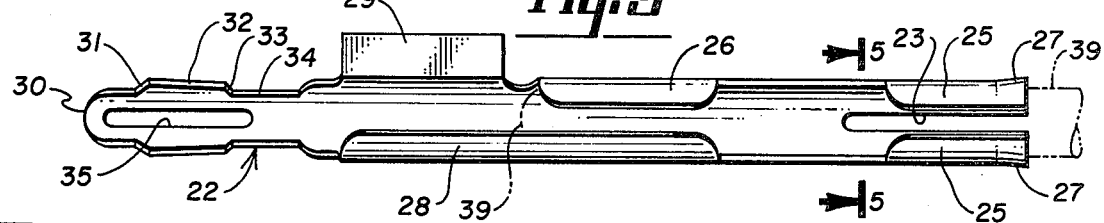
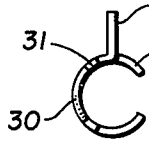 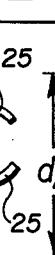 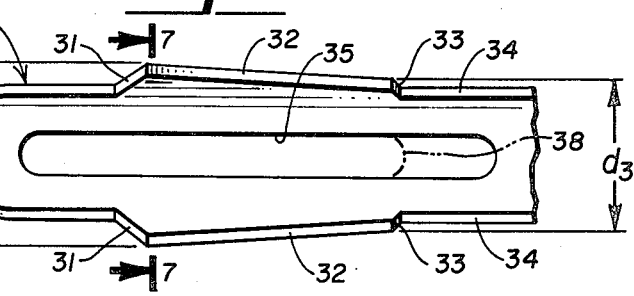
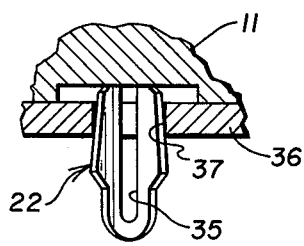 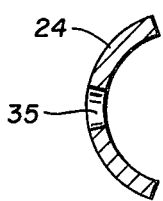 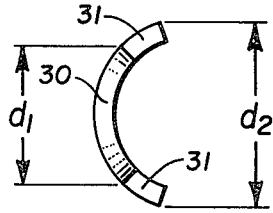

TERMINAL CONSTRUCTION

This is a continuation of application Ser. No. 178,802, filed Aug. 18, 1980, now abandoned.

BACKGROUND OF THE INVENTION

The present invention relates generally to a terminal or contact portion for use in connection with a printed circuit board, and more particularly, to a terminal or contact end for retaining a connector element or some other subassembly to a printed circuit board (PCB) during assembly.

During the construction of printed circuit board assemblies requiring the connection of various connectors, subassemblies, etc. to the printed circuit board, means are provided on the connector or subassembly for properly aligning the same and for making electrical connection with respect to the desired circuits on the printed circuit board. In the prior art, these means include a plurality of terminal or contact end portions extending from the connector or subassembly and adapted for extension through corresponding holes or openings in the PCB. Normally, these connectors or other subassemblies are temporarily retained with respect to the PCB during assembly by bending or spreading the terminal ends on the back side of the board. Then, after assembly of the PCB structure is complete, the connectors and other subassembly elements are more permanently secured by soldering or other conventional means.

A disadvantage of this prior technique of temporarily retaining connectors or subassemblies to the PCB during assembly is that it requires the additional manual step of bending or spreading the terminal ends on the back side of the PCB. This step is time consuming, compared to the overall time necessary to assemble the printed circuit board assembly, and does not lend itself acceptably to high speed or inexpensive construction. Accordingly, there is a need in the art for a PCB terminal or contact end portion capable of retaining a connector or other subassembly unit to a printed circuit board during the assembly process.

SUMMARY OF THE INVENTION

In contrast to the prior art, the present invention relates to a terminal or contact portion of a connector or other electrical subassembly which is capable of satisfactorily retaining such connector or subassembly to a printed circuit board during the assembly process. In particular, this terminal or contact portion includes a rolled up locking tail or terminal which extends outwardly from the connector or subassembly and is adapted for insertion through a hole or opening in the PCB. As will be described in detail below with respect to the preferred embodiment, the terminal of the present invention comprises a rolled up portion having an outer configuration conforming to an exterior surface portion of a cylinder. Preferably this cylindrical configuration has a radius of curvature greater than the radius of the opening in the printed circuit board through which the terminal extends; however, it is contemplated that various configurations of rolled up terminals having a radius of curvature less than the PCB opening could be constructed. The terminal also includes an insertion ramp portion enabling the terminal end to be inserted through the opening in the printed circuit board of smaller diameter and a terminal retaining or locking ramp. This ramp preferably has a length greater than the thickness of the printed circuit board into which the terminal is inserted; however, if sufficient terminal retaining force is provided, the ramp length can be less than the thickness of the PCB. The terminal end also includes an elongated slot or opening extending longitudinally therealong to impart spring characteristics to the locking ramp portion to draw the connector or subassembly unit to the PCB and retain the same in such position during assembly of the PCB.

This structure eliminates the necessity for the person assembling the PCB structure to bend or spread the terminal or contact ends to retain the connector to the printed circuit board. The locking ramp portion of the terminal end structure can have a length greater than the thickness of the printed circuit board into which the same is extended; thus, providing it with the capability of retaining terminal ends mounted with respect to the connector at different longitudinal levels. Such a terminal end can also be used with printed circuit boards of different thicknesses.

Accordingly, an object of the present invention is to provide a terminal or a contact portion for a connector adapted for connection with a printed circuit board.

Another object of the present invention is to provide an improved terminal or contact end as described above which is capable of drawing the connector or subassembly unit to the printed circuit board and retaining the same during assembly.

A further object of the present invention is to provide a terminal or contact end adapted for temporarily securing a connector or subassembly unit to printed circuit boards of different thicknesses.

These and other objects of the present invention will become apparent with reference to the drawings, the description of the preferred embodiment and the appended claims.

DESCRIPTION OF THE DRAWINGS

FIG. 1 is a pictorial view of a connector or other subassembly unit which is intended for connection with a printed circuit board.

FIG. 2 is a side elevational view of the terminal or contact element of the present invention.

FIG. 3 is a top elevational view of the terminal or contact element of the present invention.

FIG. 4 is an end elevational view of the terminal or contact element as shown in FIG. 3.

FIG. 5 is a cross-sectional view of the terminal or contact element as viewed along the section line 5—5 of FIG. 3.

FIG. 6 is an enlarged elevational view of the locking tail portion of the terminal or contact element of the present invention.

FIG. 7 is a cross-sectional view of the locking tail as viewed along the section line 7—7 of FIG. 6.

FIG. 8 is an end elevational view of the locking tail of the terminal or contact element as shown in FIG. 6.

FIG. 9 is a view, partially in section, showing a connector or other subassembly unit temporarily retained with respect to a printed circuit board by the locking terminal of the present invention.

DESCRIPTION OF THE PREFERRED EMBODIMENT

Reference is first made to FIG. 1 showing a pictorial view of a subassembly or connector element 10 adapted for connection with a printed circuit board. As illustrated, the connector element 10 includes an inner body portion 11 constructed of a plastic or other material having electrically insulative qualities. The body 11 is surrounded by a metal can portion 12 for purposes of shielding the internal contacts of the connector from outside interference. In the preferred embodiment, the metal can 12 is constructed of stainless steel. The can 12 includes a longitudinally extending rib 20 to assist in properly aligning a mating male connector element (not shown) and a bump or raised portion 13 positioned on the exterior surface of the can 12 between a pair of longitudinally extending slots 17, 17. The slots 17, 17 form a spring which allows the bump 13 to move in and out to insure electrical connection with the male connector. A top portion of the can 12 is provided with an elongated opening 14 and an associated spring latch member 16 to help retain the male member to the connector member 10.

The rearward end of the body 11 is provided with three longitudinally, outwardly projecting terminal or contact end portions 22 and a longitudinally extending ground lug 21. The ground lug 21 is electrically connected with the ground clip member 18 via the screw 19 which is in turn secured to the can 12. As shown, the group clip 18 is electrically connected with the can member 12 for shielding the contacts from external interference. During use, the three contact or terminal end portions 22 and the ground lug 21 are inserted through corresponding openings in a printed circuit board. A sectional view showing one of the terminal ends 22 inserted through an opening 37 in a printed circuit board 36 is illustrated in FIG. 9.

As described earlier, one of the problems existing in the prior art has been the inability of the contact or terminal ends to retain a subassembly unit such as the female connector member 10 to a printed circuit board during the assembly procedure. Terminals in the prior art have provided no means for this securement. Thus, when such terminal ends are inserted into the PCB, they are either bent over or spread on the opposite or back side of the printed circuit board to hold the subassembly in place during assembly of the other elements on the board. This is a time consuming step and one that does not lend itself readily to high speed production.

The present invention relates specifically to an improved construction for the contact or terminal end adapted for insertion into a printed circuit board. In particular, the terminal end of the present invention has a construction which enables it to be securely retained to the PCB during assembly, thus, eliminating the undesirable step of manually bending or spreading the terminal ends. The construction of the terminal of the present invention is illustrated in FIGS. 2–8. As illustrated best in FIGS. 2, 3, 4 and 5, the terminal comprises a generally rolled up portion of electrically conductive material having a rearward end 22 adapted for insertion into a printed circuit board and a forward, elongated section 24 adapted for retention within the body 11 of the female connector element 10 (FIG. 1) or another similar subassembly unit. The portion of the terminal disposed within the body 11 includes a pair of tab members 26 and 28 which form a portion of the rolled up configuration of the terminal and which have outer edges which face each other. The primary function of these tab members 26 and 28 is to provide the rolled up terminal portion with additional strength to avoid distortion of the terminal and to keep the terminal properly centered within the core openings in the element 11.

A third tab portion 29 extends radially outwardly from the rolled up surface of the terminal disposed within the connector element and is intended to provide stability for the terminal. This tab 29 also eliminates or reduces the possible longitudinal movement of the terminal relative to the body portion 11 during insertion of the rearward end 22 into the PCB.

A pair of additional tabs 25, 25 are positioned at the forward end of the terminal and have inner surfaces spaced from and facing each other. A slot 23 is also provided at the forward end of the terminal to provide spring properties to the tabs 25, 25. The forward end of the terminal is also provided with an outwardly extending flange portion 27 to facilitate the insertion of the male pin member 39.

The rearward or terminal end portion 22 of the terminal is illustrated best in FIGS. 6, 7 and 8. As illustrated, the terminal end 22 includes an elongated portion of a rolled up member and comprises a surface portion of a generally cylindrical configuration. This is best shown in FIGS. 7 and 8. Thus, the terminal end 22 comprises a portion of a substantially cylindrical surface whose cross-sectional configuration forms an arc no greater than 180°. The terminal end 22 includes a first or rearwardly extending portion 30 having an effective width dimension of $d_1$. The rearward most end of this portion 30 is rounded to avoid sharp edges and to facilitate insertion of the terminal end into the printed circuit board. An intermediate or second portion of the terminal end 22 includes a terminal retaining ramp means having a pair of opposing ramp surfaces or sections 32, 32 extending generally outwardly relative to the rearward end portion 30. This retaining ramp means has an effective width dimension at its rearward end of $d_2$ and an effective width dimension at its forward end of $d_3$. In the preferred embodiment, the dimension $d_3$ is less than the dimension $d_2$, thus providing the ramp means with a sloping or inclined surface to assist in retaining the terminal end 22 within the printed circuit board. The forward end of the terminal end 22 includes a third portion having an effective width dimension less than the dimension $d_3$. Each of the longitudinal ramp surfaces 32, 32 is connected with the rearward end portion 30 by a short lead-in ramp 31, 31. The forward ends of the ramp surfaces 32, 32 are connected with the side portions 34, 34 by the sections 33, 33.

The terminal end 22 is further provided with an elongated, longitudinally extending, closed loop opening or slot 35 positioned in the center of the terminal end and extending from the rearward portion 30 through at least a substantial portion of the intermediate portion from which the ramp surfaces 32, 32 extend. As will be described in greater detail below, the function of this elongated slot 35 is to provide a resiliency or spring characteristic to the terminal end 22, thus permitting its insertion into a printed circuit board opening having a diameter of less than the dimension $d_2$. It has been found that the resiliency or spring characteristics resulting from this slot 35 varies with the length of the slot. Generally, the shorter the slot, the stronger or less resilient the terminal end is. Thus, a slot having a length illustrated by the broken line 38, would have a resiliency less than a slot with a length shown by the solid line 35. Thus, a terminal end with a slot length 38 would require a greater insertion force than the slot length 35. Similarly, the wider the slot, the more resilient the spring characteristics. The spring characteristics of the terminal are also dependent upon the type of material from which the terminal is made and its thickness. In the preferred embodiment, the terminal is made from a phosphor bronze material having an approximate thickness of 0.010 inches and the slot has a width greater than one-fourth, but less than one-third, the effective width $d_1$ of the rearward end 30.

As illustrated best in FIG. 9, the terminal end 22 is intended to be inserted into an opening 37 of a printed circuit board 36 and retained therein by the spring characteristics generated by the construction of the terminal end. This is accomplished by constructing the terminal end 22 with certain relative dimensions capable of facilitating the retention in circuit boards with various thicknesses. One of the important dimensions of the terminal end 22 is dimension $d_1$, the effective width of the rearward portion 30. Preferably, the dimension $d_1$ should be slightly less than the normal diameter of the opening 37 in a printed circuit board. If the dimension $d_1$ were greater, an undesirable amount of force would be necessary to insert the terminal end 22 into the PCB opening. The dimensions $d_2$ and $d_3$, the rearward and forward effective widths of the ramp sections 32, 32, respectively, are also important. In order to function in accordance with the present invention, the dimension $d_2$ is preferably greater than the opening 37 in the PCB. If it were less than this size, it would be incapable of performing the retaining function that it is designed to perform. It is also preferable that the dimension $d_3$ be greater than the opening 37 in the printed circuit board; however, this can be slightly less than the size of the opening 37 (FIG. 9), particularly for thicker printed circuit boards. Also, the radius of curvature of the cylindrical configuration of the rolled up terminal end should preferably have a radius greater the radius of the opening in the PCB. Preferably the radius of such cylindrical configuration should be constant.

It is also preferable if the ramp sections 32, 32 are sufficient in length to accommodate different thicknesses of printed circuit boards. In the present state of the art, printed circuit boards come in various thicknesses ranging from a thickness of approximately 0.031 inches to a thickness of approximately 0.125 inches. The ramp length and taper should be adjusted to fit the particular application for which the terminal is intended.

During operation, the connector member 10 or other subassembly unit is inserted into a PCB such as that illustrated in FIG. 9 by insertion of each of the terminal ends 22 together with the ground lug 21 into corresponding openings in the printed circuit board. As the terminal ends 22 are inserted into such openings, the forward portions 30 pass easily through the openings since the dimensions $d_1$ are preferably smaller than the openings. Additional insertion force is then needed to cause further insertion of the terminal ends 22 into the printed circuit board. This further insertion results in the tab or ramp portions 32, 32 being compressed inwardly because of the spring properties imparted by the elongated slot 35, thus permitting the terminal ends 22 to be completely inserted into the printed circuit board opening 37 (FIG. 9). When fully inserted, the connector element 10 is retained to the printed circuit board by the spring force generated in the compressed ramp members 32, 32 until the complete board is assembled. At that time the various elements such as the connector member 10 are secured to the board by soldering or other conventional connecting means.

In the preferred embodiment, the terminal ends 22 are electrically connected with operative portions of the connector or subassembly being connected with the PCB; however, such construction is not necessary to utilize the benefits of the present invention. For example, the connector or subassembly can include terminal ends which are not electrically connected to any circuitry or contacts, but whose sole function is to retain the connector or subassembly to the PCB until the same can be more permanently secured by soldering or the like.

Although the description of the preferred embodiment has been quite specific, it is contemplated that various changes and modifications could be made to the preferred embodiment without deviating from the spirit of the present invention. Thus, it is contemplated that the scope of the present invention be dictated by the appended claims rather than by the description of the preferred embodiment.

I claim:

1. A terminal for insertion into an opening in a printed circuit board or the like comprising a partially rolled up terminal end having first and second spaced apart side edges including:
    a first end section having an effective width less than the diameter of said opening;
    a second section integrally joined with said first end section and having an elongated terminal retaining ramp means with at least a portion having an effective width greater than the diameter of said opening;
    means for providing resiliency to said second section comprising an elongated, longitudinally extending closed loop slot disposed within said terminal end and extending throughout at least a substantial portion of said second section.

2. The terminal of claim 1 wherein the cross-section of said partially rolled up terminal end forms an arc no greater than 180°.

3. The terminal of claim 1 wherein the length of said elongated terminal ramp is greater than the thickness of the printed circuit board into which it is designed for insertion.

4. The terminal of claim 1 wherein said terminal retaining ramp means is defined by portions of said first and second spaced apart side edges.

5. The terminal of claim 1 including a third section having an effective width less than said second section.

6. The terminal of claim 5 including a lead in ramp means joining said first and second sections.

7. The terminal of claim 6 wherein said lead in ramp means joins said first section and one end of said terminal retaining ramp means.

8. The terminal of claim 6 wherein said terminal retaining ramp means includes first and second ends.

9. The terminal of claim 8 wherein said lead-in ramp means joins said first section with said first end of said terminal retaining ramp means.

10. The terminal of claim 9 wherein the effective width of said first end of said terminal retaining ramp means is greater than the diameter of said opening.

11. The terminal of claim 10 wherein the effective width of said second end of said terminal retaining means is less than said first end.

12. The terminal of claim 11 wherein said terminal retaining ramp means includes a pair of opposing and continuous ramp surfaces disposed on opposite sides of said slot and extending from said first end to said second end of said terminal retaining ramp.

13. The terminal of claim 1 wherein said slot extends from a portion of said first section through at least a portion of said second section.

14. The terminal of claim 13 wherein said slot extends through the entirety of said second section.

15. The terminal of claim 14 wherein the width of said slot is greater than one-fourth, but less than one-third, the effective width of said first section.

16. The terminal of claim 1 wherein said terminal end conforms to a surface portion of a cylindrical configuration.

17. The terminal of claim 16 wherein said cylindrical configuration has a radius of curvature greater than the radius of said opening.

18. The terminal of claim 1 wherein said terminal retaining ramp means includes first and second ends.

19. The terminal of claim 18 wherein said first section is joined with said first end of said terminal retaining ramp means.

20. The terminal of claim 18 wherein the effective width of said first end of said terminal retaining ramp means is greater than the diameter of said opening.

21. The terminal of claim 20 wherein the effective width of said second end of said terminal retaining means is less than said first end.

22. The terminal of claim 21 wherein said terminal retaining ramp means includes a pair of opposing ramp surfaces disposed on opposite sides of said slot.

23. The terminal of claim 21 wherein the length of said elongated terminal ramp is greater than the thickness of the printed circuit board into which it is designed for insertion.

24. The terminal of claim 21 including a lead-in ramp means joining said first and second sections.

25. The terminal of claim 24 wherein said lead-in ramp means joins said first section and one end of said terminal retaining ramp means.

* * * * *